United States Patent
Aota et al.

(10) Patent No.: US 7,587,989 B2
(45) Date of Patent: Sep. 15, 2009

(54) PLASMA PROCESSING METHOD AND APPARATUS

(75) Inventors: Yukito Aota, Kanagawa (JP); Masahiro Kanai, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 294 days.

(21) Appl. No.: 10/755,300

(22) Filed: Jan. 13, 2004

(65) Prior Publication Data

US 2004/0140036 A1  Jul. 22, 2004

Related U.S. Application Data

(62) Division of application No. 09/949,616, filed on Sep. 12, 2001, now Pat. No. 6,720,037.

(30) Foreign Application Priority Data

Sep. 14, 2000 (JP) ............................... 2000-279756

(51) Int. Cl.
*C23C 16/00* (2006.01)
*C23F 1/00* (2006.01)
*H01L 21/306* (2006.01)
*H05B 31/26* (2006.01)

(52) U.S. Cl. .............................. 118/723 E; 156/345.43; 156/345.44; 156/345.45; 156/345.47; 315/111.21

(58) Field of Classification Search ................. 118/723; 156/345.43, 345.44, 345.47, 345.45
See application file for complete search history.

(56) References Cited

U.S. PATENT DOCUMENTS

| | | | |
|---|---|---|---|
| 4,461,239 A * | 7/1984 | Cannella et al. ............. 118/718 |
| 4,802,968 A * | 2/1989 | Hendrix et al. ......... 204/298.12 |
| 4,933,203 A | 6/1990 | Curtins ........................ 427/38 |
| 5,006,192 A * | 4/1991 | Deguchi ................ 156/345.44 |
| 5,705,019 A * | 1/1998 | Yamada et al. ......... 156/345.44 |
| 5,846,885 A | 12/1998 | Kamata et al. ................. 216/67 |
| 5,895,558 A | 4/1999 | Spence ........................ 427/569 |

(Continued)

FOREIGN PATENT DOCUMENTS

JP             5-51753          3/1993

(Continued)

OTHER PUBLICATIONS

Machine Translation (in English) of JP 05-051753 (dt. Mar. 2, 1993).*

(Continued)

*Primary Examiner*—Parviz Hassanzadeh
*Assistant Examiner*—Rakesh K Dhingra
(74) *Attorney, Agent, or Firm*—Fitzpatrick, Cella, Harper & Scinto

(57) ABSTRACT

In a plasma processing method, on a back side of a cathode electrode is provided at least one conductor plate d.c. potentially insulated from the cathode electrode and an opposing electrode, and the cathode electrode and the conductor plate are enclosed with a shielding wall such that a ratio of an inter-electrode coupling capacitance provided by the cathode electrode and the opposing electrode to a coupling capacitance provided by the cathode electrode and a bottom surface of the shielding wall on the back side of the conductor plate is not less than a predetermined value. Thereby, a high-quality, high-speed plasma processing is realized.

1 Claim, 5 Drawing Sheets

U.S. PATENT DOCUMENTS

| | | | |
|---|---|---|---|
| 5,932,302 A | 8/1999 | Yamazaki et al. | 427/577 |
| 5,997,687 A * | 12/1999 | Koshimizu | 156/345.44 |
| 6,031,198 A | 2/2000 | Moriyama et al. | 219/121.59 |
| 6,142,096 A | 11/2000 | Sakai et al. | 118/723 E |
| 6,152,071 A * | 11/2000 | Akiyama et al. | 118/723 VE |
| 6,162,709 A | 12/2000 | Raoux et al. | 118/723 ER |
| 6,428,859 B1 | 8/2002 | Chiang et al. | 427/570 |
| 6,478,924 B1 * | 11/2002 | Shamouilian et al. | 156/345.48 |
| 6,564,744 B2 * | 5/2003 | Nakahigashi et al. | 118/723 E |
| 6,857,387 B1 * | 2/2005 | Sun et al. | 118/723 E |
| 2001/0009220 A1 | 7/2001 | Mizuno et al. | 427/569 |
| 2002/0056415 A1 * | 5/2002 | Mashima et al. | 118/723 E |

FOREIGN PATENT DOCUMENTS

| | | |
|---|---|---|
| JP | 5-226681 | 9/1993 |
| JP | 8-20874 | 3/1996 |
| JP | 8-167594 | 6/1996 |

OTHER PUBLICATIONS

Masaharu Shiratani et al., "Methods of Suppressing Cluster Growth in Silane RF Discharges," 609 *Mat. Res. Soc. Symp. Proc.*, pp. A5.6.1-A5.6.6 (2000).

* cited by examiner

PLASMA PROCESSING METHOD AND APPARATUS

This application is a division of application Ser. No. 09/949,616, filed on Sep. 12, 2001, now U.S. Pat. No. 6,720,037.

BACKGROUND OF THE INVENTION

1. Field of the Invention

The present invention relates to a deposited film forming method and apparatus using a high frequency discharge, and more particularly to a plasma processing method and apparatus for a plasma CVD apparatus, a plasma etching apparatus, or the like used for producing a silicon-based amorphous or microcrystalline semiconductor such as a solar cell, a photovoltaic element, a display, etc.

2. Related Background Art

Hitherto, in a deposited film forming method of forming a functional thin film using a plasma, a high frequency plasma of a frequency from 13.56 MHz to the VHF band or further to the microwave band has normally been used to realize a semiconductor element, a photovoltaic element, etc. using a non-crystalline thin film or a crystalline thin film.

For example, in a plasma CVD method using a high frequency plasma, a non-crystalline thin film or a crystalline thin film of a silicon-based semiconductor element such as a solar cell, etc. has been formed.

In order to realize a high-quality non-crystalline or crystalline thin film, it is important to generate only radicals required to obtain a high-quality thin film and cause a surface reaction. To attain this, the supply amount of a high frequency power is reduced to control generation of those radicals which are not necessary for forming a high-quality thin film.

However, such a method is not sufficient in productivity, and is not suitable for industrial use. Therefore, an effort has been made to increase the deposition rate. However, in order to attain this, a large volume of a source gas needs to be decomposed, so that it is effective to increase the supply amount of a high frequency power and to raise the frequency of the high frequency power to increase the density of the plasma.

However, increasing the high frequency power will result in formation of not only radicals required for forming a good quality thin film but also radicals or ions which degrade the film quality. Furthermore, active radicals such as $SiH_2$ are liable to grow in a cluster-like shape, and a plasma containing a large amount of active radicals such as $SiH_2$, etc. will incorporate the $SiH_2$ or clusters into the semiconductor thin film to providing a defective film, so that a good semiconductor thin film can not be obtained.

For example, when the inventors formed a non-crystalline silicon film on a 500 mm×850 mm substrate (also functioning as a grounding electrode) at a film deposition rate of 15 Å/sec by using a plasma CVD apparatus having a 500 mm×850 mm parallel plate type cathode and supplying a high frequency power of 13.56 MHz, the content of $SiH_2$ in the thin film reaches about 10%, thereby failing to obtain a best thin film. On the contrary, there was posed the problem that a powdery substance (polysilane powder, etc.) was generated as a by-product in an end portion of the discharge space in the direction of flow of the source gas.

According to the heretofore obtained reports, there has been tried a method of applying a high frequency power in a pulse fashion to suppress the growth of active radicals to clusters, thereby preventing the generation of a powdery substance, or the like.

For example, Japanese Patent Application Laid-Open Nos. 5-226681, 5-51753, and 8-20874, etc. describe a film formation dust reducing method and a flake reducing method by applying an amplitude modulation to a high frequency power. However, little is described about the characteristic data of the quality of the formed films, and the deposition rates are not clearly described.

The inventors have applied a high frequency power with a low frequency pulse modulation to a conventional parallel plate type electrode and studied the results. However, even when the pulse modulation frequency and the duty were varied, the content of $SiH_2$ in the formed semiconductor thin films were hardly reduced, and no thin films with good film characteristic such as photo/dark conductivities, etc. could be obtained. Furthermore, the deposition rates of the films were as small as about 3 Å/sec. The reason for this is that the discharge starting voltage applied at the rising of the modulation pulse becomes high, whereby the gas is decomposed into various kinds of radicals and ions, and only those radicals which are necessary for forming a high-quality thin film cannot be selectively generated in a large amount.

Thus, according to the conventional methods, since the defect density of a deposited film becomes high due to gas polymerization or ion bombardment and it is difficult to obtain good film quality, it has been considered general to adopt a film forming rate of 3 Å/sec or less in the light of productivity.

However, in order to improve the productivity of large-area products such as displays or solar cells using semiconductors of silicon-based non-crystalline or crystalline thin films, etc., it is necessary to form films of semiconductors such as silicon-based non-crystalline or crystalline thin films, etc. with higher quality than before with a large area at a high speed. There are similar problems with the spattering apparatus and the etching apparatus.

SUMMARY OF THE INVENTION

It is, therefore, an object of the present invention to solve the above mentioned problems and to provide a method and apparatus that can perform a high-quality, high-speed plasma processing.

It is another object of the present invention to provide a deposited film forming method and apparatus that can form a high-quality deposited film free from defects or photodegradation with a large area at a high speed, and also can form a high-quality deposited film with a large area at a high speed even in deposited film formation using the plasma CVD method, the spattering method, etc.

According to a first aspect of the present invention, there is provided a plasma processing method comprising introducing a gas into a discharge space having provided therein a cathode electrode and an opposing electrode opposed to the cathode electrode, and converting the gas into a plasma by a high frequency power to process an article, the method comprising the steps of:

providing on a back side of the cathode electrode at least one conductor plate d. c. potentially insulated from the cathode electrode and the opposing electrode;

enclosing the cathode electrode and the conductor plate with a shielding wall to configure a discharge space such that a ratio of an inter-electrode coupling capacitance provided by the cathode electrode and the opposing electrode to a coupling capacitance provided by the cathode electrode and a bottom surface of the shielding wall on the back side of the conductor plate is not less than a predetermined value; and supplying a high frequency power with a pulse modulation to the cathode electrode to convert the gas into a plasma.

It is preferable in the method that the ratio of the inter-electrode coupling capacitance provided by the cathode electrode and the opposing electrode to the coupling capacitance provided by the cathode electrode and the bottom surface of the shielding wall on the back side of the conductor plate is made 1/3 or more.

It is preferable in the method that a modulation frequency of the pulse modulation is set to 50 Hz to 100 KHz.

It is preferable in the method that a percentage (duty) of a high frequency application time to a period of a modulation frequency of the pulse modulation is set within a range of 15% to 60%.

It is preferable in the method that a high frequency power of a power source frequency of 30 MHz to 150 MHz is used as the high frequency power.

According to a second aspect of the present invention, there is provided a plasma processing apparatus having a discharge space having provided therein a cathode electrode and an opposing electrode opposed to the cathode electrode, for introducing a gas into the discharge space and converting the gas into a plasma by a high frequency power to process an article, the apparatus comprising:

at least one conductor plate provided on a back side of the cathode electrode and d.c. potentially insulated from the cathode electrode and the opposing electrode;

a shielding wall for enclosing the cathode electrode and the conductor plate;

a discharge space configured such that a ratio of an inter-electrode coupling capacitance provided by the cathode electrode and the opposing electrode to a coupling capacitance provided by the cathode electrode and a bottom surface of the shielding wall on the back side of the conductor plate is not less than a predetermined value; and power supply means for supplying a high frequency power with a pulse modulation to the discharge space.

It is preferable that the apparatus is configured such that the ratio of the inter-electrode coupling capacitance provided by the cathode electrode and the opposing electrode to the coupling capacitance provided by the cathode electrode and the bottom surface of the shielding wall on the back side of the conductor plate is made 1/3 or more.

It is preferable that the apparatus further comprises pulse modulation means for setting a modulation frequency of the pulse modulation to 50 Hz to 100 KHz.

It is preferable that the apparatus further comprises means for setting a percentage (duty) of a high frequency application time to a period of a modulation frequency of the pulse modulation within a range of 15% to 60%.

It is preferable that the apparatus is configured such that a high frequency power of a frequency of 30 MHz to 150 MHz is supplied as the high frequency power from a high frequency power source.

It is also preferable that the opposing electrode is a grounding electrode.

Further, the opposing electrode may function also as an article to be processed (simply referred to as "article") such as a substrate.

DETAILED DESCRIPTION OF THE PREFERRED EMBODIMENTS

Figure 1:
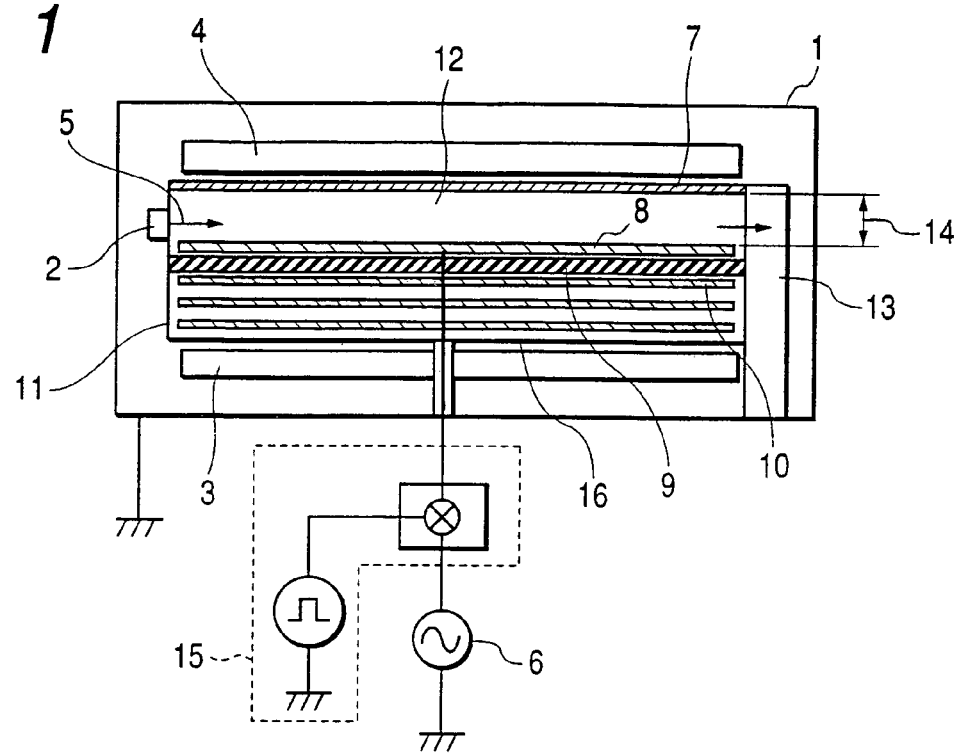
FIG. 1 is a schematic view showing an example of the deposited film processing apparatus according to an embodiment of the present invention.

With reference to the embodiments of the present invention, a plasma CVD apparatus with the above mentioned configuration will be described below.

In the apparatus, by making greater the ratio of an inter-electrode coupling capacitance to a coupling capacitance of a cathode electrode and a bottom surface of a shielding wall than that of the conventional apparatuses, and by configuring a conductor plate as described above, the power radiation into the discharge space can be improved to further increase the deposition rate of a deposited film.

Furthermore, since the inter-electrode coupling capacitance is large, the discharge starting voltage at the time of rising of the modulation pulse can be controlled to be lowered, so that it becomes possible to prevent the incorporation into the thin film of active radicals generated at the discharge starting time in each modulation pulse period or the damage to the thin film by ions while maintaining a high film forming rate. Furthermore, the generation of a powdery substance as a by-product during film formation can be suppressed.

Furthermore, by using the deposited film forming method, excellent amorphous and microcrystalline silicon films with less dangling bonds than before can be formed while maintaining a high film-forming rate of 10 Å/sec or more in a large-area reaction space. Further, a semiconductor thin film with little photodegradation can be formed.

It should be understood that the present invention can be applied not only to the plasma CVD apparatus but also to a spattering apparatus and an etching apparatus, and a high-speed plasma processing apparatus with a large area can also be realized.

Described above are obtained based on the following findings as a result of the study of the inventors carried out on various conditions.

That is, the inventors have found that in the capacitive coupled parallel plate electrode structure, when a conductor plate is provided on a back side of a cathode electrode in such a state as to be insulated with regard to direct current (d.c) potential from the cathode electrode and a grounding electrode as an opposing electrode, and the coupling capacitance provided by the bottom surface of the shielding wall on the back side of the conductor plate and the cathode electrode is made approximately 360 pF and the inter-electrode coupling capacitance is made larger than 120 pF, and an appropriate pulse modulation frequency and duty are selected, and a high frequency power of the VHF band is modulated thereby and supplied. to a discharge space, a film can be formed at a high speed while extremely reducing the $SiH_2$ content of the thin film. Furthermore, it has been found that the generation of a powdery substance called polysilane, which is a by-product, can be remarkably suppressed.

Thereby, it has become apparent that the discharge starting voltage for each pulse rising can lowered, whereby the generation of active radicals generated at a high discharge starting voltage can be suppressed and the generation of clusters can be suppressed, and further that the damage to a thin film by ions due to the discharge starting voltage can also be suppressed, while improving the supply efficiency of a high frequency power and forming a film at a high speed.

In an embodiment of the present invention, by adopting the above mentioned configuration, and by supplying a high frequency power to the discharge space between the cathode electrode and the grounding electrode while effecting pulse modulation with a modulation frequency within the range of 50 Hz to 100 KHz, the incorporation of active radicals such as $SiH_2$, etc. into the film can be made 2% or less, and the generation of a powdery substance which is a by-product can be more efficiently be suppressed.

Further, in another embodiment of the present invention, by adopting the above mentioned configuration, and by supplying a high frequency power to the discharge space between the cathode electrode and the grounding electrode while effecting pulse modulation with a duty within the range of 15% to 60%, the incorporation of active radicals such as $SiH_2$, etc. into the film can be made 2% or less, and the generation of a powdery substance which is a by-product can be more efficiently be suppressed.

The embodiment of the present invention can be effectively applied to the deposited film forming method in which a high frequency plasma is pulse-modulated and used. Especially, the effect is noteworthy within the range from 30 MHz to 150 MHz.

The embodiments of the present invention will be described below further in detail by referring to the attached drawings.

Figure 2:
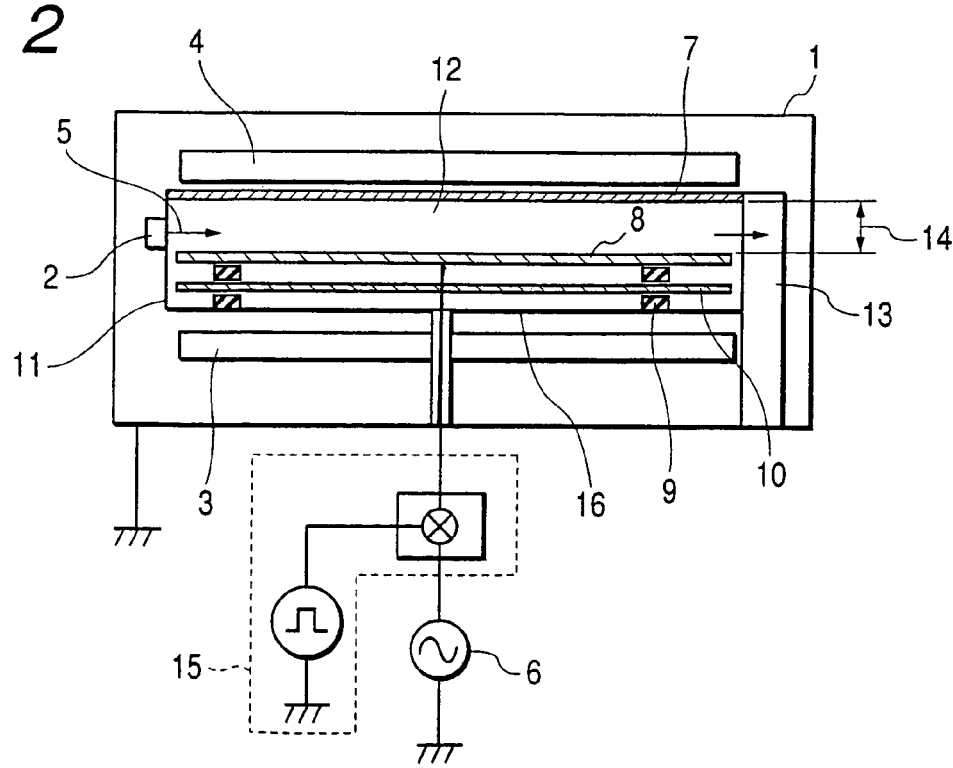
FIG. 2 is a schematic view showing an example of the deposited film processing apparatus according to another embodiment of the present invention.

FIGS. 1 and 2 each show an example of the deposited film processing apparatus according to an embodiment of the present invention.

In FIGS. 1 and 2, reference numeral 1 denotes a vacuum vessel forming a plasma CVD chamber. Reference numeral 2 denotes a gas supply means for providing a source gas from one part of the plasma CVD chamber, and performing a deposited film forming process in a reaction space 12 of the plasma CVD chamber by a high frequency glow discharge. Reference numeral 3 denotes a plasma CVD chamber header, reference numeral 4 denotes a substrate heater, and reference numeral 5 denotes a gas flow direction. Reference numeral 6 denotes a high frequency power source.

Reference numeral 7 denotes a grounding electrode (substrate holder) opposing a cathode electrode 8, reference numeral 9 denotes an insulator (quartz), and reference numeral 10 denotes a conductor plate provided on the back side of the cathode electrode 8 and d.c. potentially insulated by the insulator 9 through direct current potential from the cathode electrode 8 and the grounding electrode 7. Three pieces of conductor plates are provided in FIG. 1, and a piece of conductor plate is provided in FIG. 2.

Reference numeral 11 denotes a shielding wall (shielding case), reference numeral 12 denotes a reaction space (discharge space), reference numeral 13 denotes an exhaust means, reference numeral 14 denotes a distance between electrodes, reference numeral 15 denotes a pulse modulation circuit, and reference numeral 16 denotes a bottom surface of a shielding wall.

A discharge space is configured such that the cathode electrode 8 and the conductor plate 10 are roughly enclosed by the shielding wall 11, and the ratio of the inter-electrode coupling capacitance provided by the cathode electrode 8 and the grounding electrode 7 to the coupling capacitance provided by the cathode electrode 8 and the bottom of the shielding wall on the back side of the conductor plate 10 is approximately 1/3 or more.

Then, by supplying a high frequency power to the cathode electrode 8 while effecting a pulse modulation, and by appropriately adjusting the frequency, the reaction space pressure, the inter-electrode coupling capacitance, and the species of a source gas, it becomes possible to form a high-quality deposited film while realizing a high-speed film formation in a large area.

Thus, the generation of the polysilane powder, which is a by-product when forming a deposited film, can effectively be suppressed, and a deposited film forming method and apparatus with a remarkably high productivity can be provided.

Described below will be the examples of the present invention, but the present invention is not limited only thereto.

EXAMPLE 1

In Example 1, an experiment was carried out to observe the change in the content of $SiH_2$ in a non-crystalline silicon film using the deposited film forming method and apparatus utilizing the plasma CVD according to the present invention with the configuration shown in FIG. 1.

The reaction space was 510 mm×510 mm, the cathode electrode size was 504 mm×504 mm, and the ratio (hereinafter referred to as "electrode coupling capacitance ratio) of the inter-electrode coupling capacitance (40 pF) to the coupling capacitance (210 pF) of the cathode electrode and the bottom surface of the shielding wall was approximately 1/5.

The film forming process was performed by the following procedure. First, the vacuum vessel 1 was evacuated to 1 Pa or less by an exhaust means. Then, argon gas was introduced at a flow rate of 100 sccm and the pressure inside the reaction chamber was maintained at 13 Pa.

Then, a power was supplied to the substrate heater, and this state was kept for two hours. After the temperature of the substrate in the plasma CVD chamber became stable, the argon gas was stopped, and a source gas $SiH_2$ at 500 sccm and hydrogen gas for dilution at 1000 sccm were supplied from the gas supply means 2.

Then, the pressure inside the plasma reaction space was controlled to be 133 Pa, and a high frequency power of VHF 30 MHz and 800 W was modulated with a modulation frequency of 10 KHz and a duty of 50% and supplied to the cathode electrode and the film formation was performed for 8 minutes. Thus, the high frequency power of the VHF band was supplied to deposit a non-crystalline silicon film on a silicon wafer substrate.

Next, the supply of the high frequency power was stopped, and the supply of the source and diluting gases and the heater power was stopped. Next, the inside of the vacuum vessel and exhaust means was purged and the apparatus was brought into atmospheric pressure using $N_2$ gas.

Thereafter, the content of hydrogen atoms in the non-crystalline silicon film deposited on the silicon wafer substrate was measured and evaluated by the absorption amount of 2007 $cm^{-1}$ (SiH) and 2085 $cm^{-1}$ ($SiH_2$) of the infrared absorption spectrum according to the transmission method using FT-IR (trade name: 1720X, mfd. by Parkin Elmer, Co.).

As a result, the content of $SiH_2$ in the non-crystalline silicon film was as high as 27%. Furthermore, polysilane adhered to the discharge space and a good thin film could not be obtained.

Next, the distance between the electrodes was varied to change the electrode coupling capacitance ratio to 1/3, and film formation was performed following the above mentioned procedure.

With the electrode coupling capacitance ratio of 1/3, no polysilane was generated, and the discharge became stable.

Thereafter, the content of $SiH_2$ in the thin film thus formed on a sample substrate was measured according to the above mentioned method, with the result that it was as good as 1.9%.

Further, when the distance between the electrodes was reduced to increase the electrode coupling capacitance ratio to 1/1, film formation was then performed following the above mentioned procedure, and the content of $SiH_2$ in the thin film formed on a sample substrate was measured according to the above mentioned method, with the result that it was as very good as 0.2%.

EXAMPLE 2

In Example 2, an experiment was carried out to observe the change in the content of $SiH_2$ and photo/dark conductivities of a non-crystalline silicon film depending on the change in the modulation frequency using the deposited film forming method and apparatus utilizing the plasma CVD according to the present invention with the configuration shown in FIG. 1.

The reaction space was 860 mm×510 mm, the cathode electrode size was 854 mm×504 mm, and the electrode coupling capacitance ratio was 1/1.

The film forming process was performed by the following procedure. First, the vacuum vessel 1 was evacuated to 1 Pa or less by an exhaust means. Then, argon gas was introduced at a flow rate of 100 sccm and the pressure inside the reaction chamber was maintained at 13 Pa.

Then, a power was supplied to the substrate heater, and this state was kept for two hours. After the temperature of the substrate in the plasma CVD chamber became stable, the argon gas was stopped, and a source gas $SiH_2$ at 500 sccm and hydrogen gas for dilution at 1000 sccm were supplied from the gas supply means 2.

Then, the pressure inside the plasma reaction space was controlled to be 133 Pa, and a high frequency power of VHF 60 MHz and 800 W was modulated with a modulation frequency of 50 KHz and a duty of 50% and supplied to the cathode electrode and the film formation was performed for 8 minutes. Thus, the high frequency power was supplied to deposit a non-crystalline silicon film on a glass substrate and a silicon wafer substrate each having a size of 854 mm×504 mm, respectively.

Next, the supply of the high frequency power was stopped, and the supply of the source and diluting gases and the heater power was stopped. Next, the inside of the vacuum vessel and exhaust means was purged and the apparatus was brought into atmospheric pressure using $N_2$ gas.

Subsequently, the film forming process was repeated in the above mentioned procedure with the modulation frequency being changed up to 200 KHz to produce non-crystalline silicon film samples.

Next, the contents of hydrogen atoms in each of the non-crystalline silicon films deposited on the silicon wafer substrates were measured and evaluated using the measuring method described in Example 1.

Furthermore, a comb-shaped electrode of 250 μm in gap and 5 cm in total length was evaporated on each of the non-crystalline silicon films deposited on the glass substrates, and the photoconductivity σp (S/cm) and the dark conductivity σd (S/cm) were measured by use of a photosensitivity measuring device made by using a laser for irradiating a light of 633 nm at 4E15 photons/cm²·sec, a power source and a microammeter (trade name: 4140B, mfd. by HP), and then the photoconductivity to dark conductivity ratio (σp/σd; referred to as "photo/dark conductivity ratio") was calculated.

Figure 5:
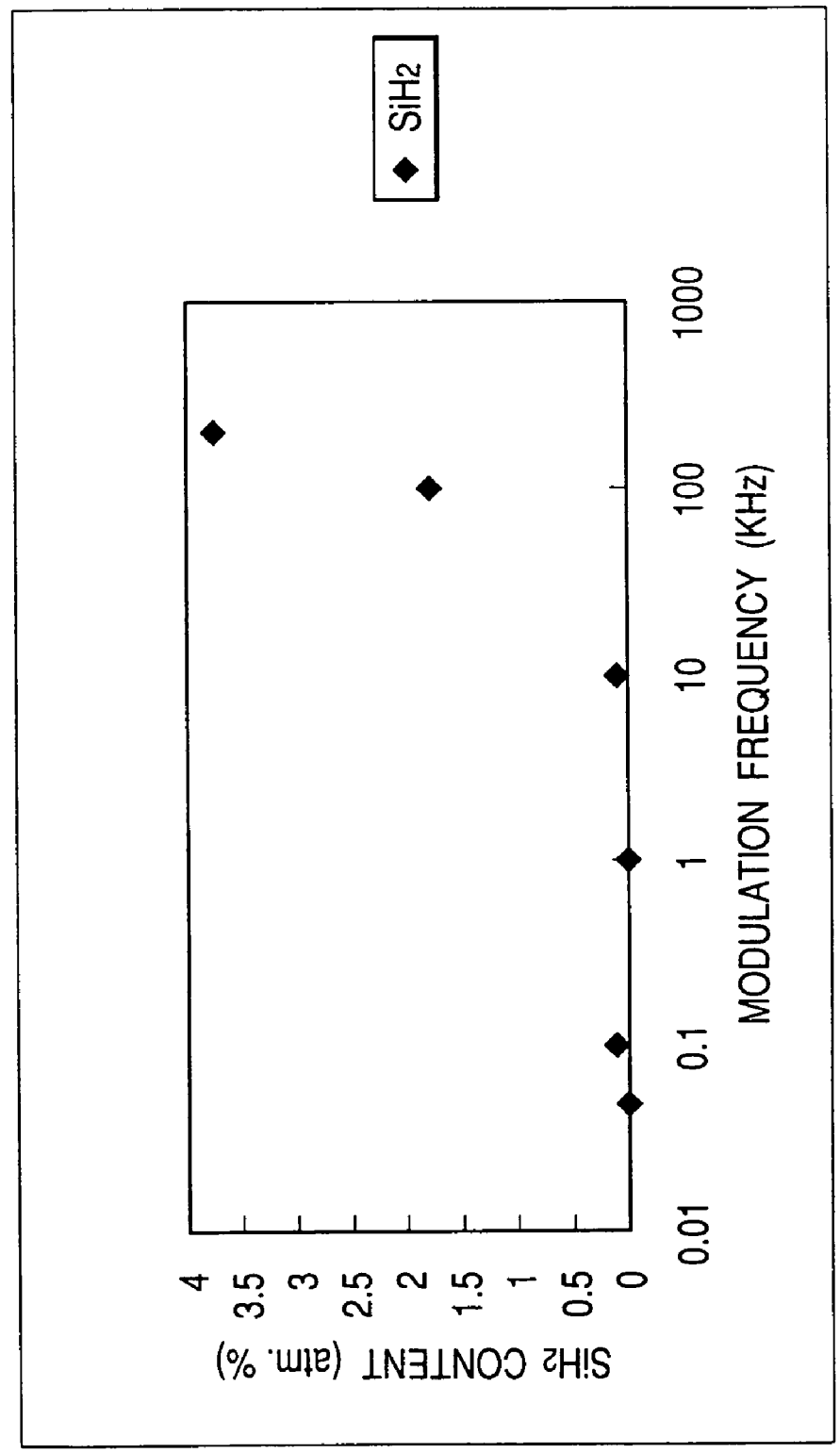
FIG. 5 is a graphical representation showing the dependency of the $SiH_2$ content of the thin film on the pulse modulation frequency described in Example 2.

As a result, as shown in FIG. 5, there was obtained the good results that the content of $SiH_2$ in the non-crystalline silicon film was less than 1 atomic % at the modulation frequency from 50 Hz to 10 KHz, and there was further obtained the good results that the photo/dark conductivity ratio σp/σd showed values of five or more figures. Moreover, at the modulation frequency of 100 KHz, a good result of 1.8 atomic % was obtained.

Figure 3:
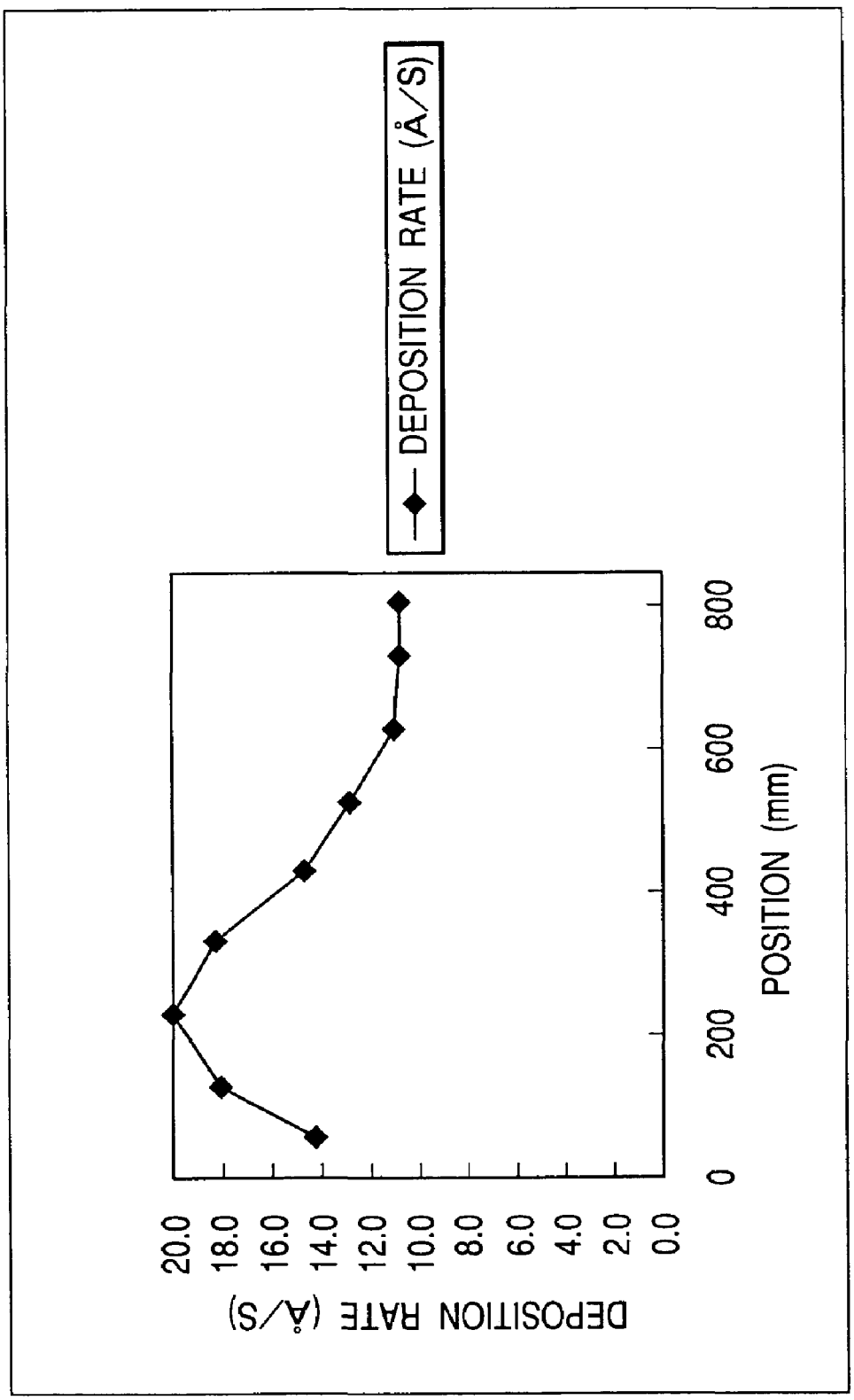
FIG. 3 is a graphical representation showing a film forming rate (deposition rate) distribution at a pulse modulation frequency of 10 KHz described in Example 2.
Figure 4:
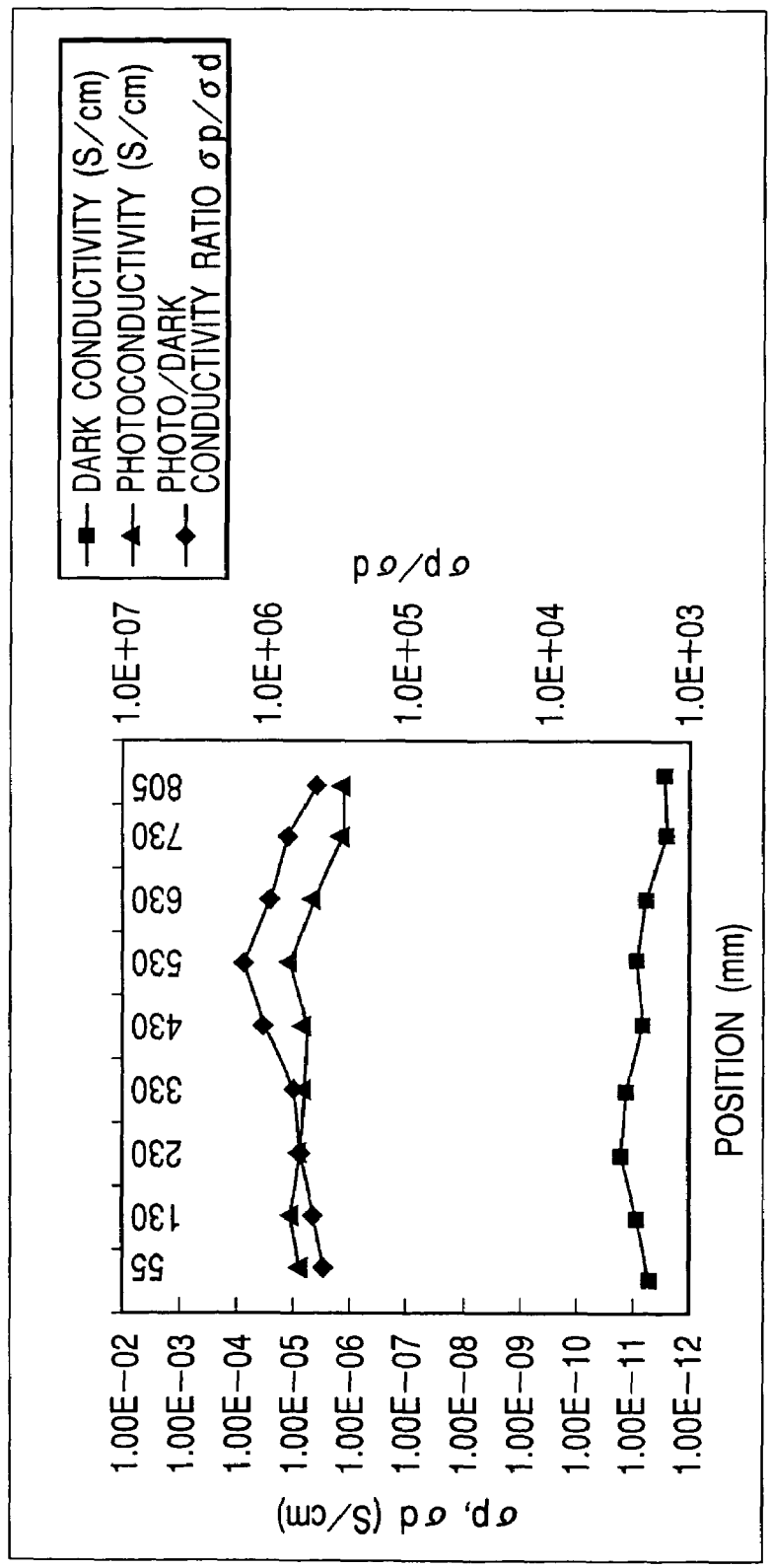
FIG. 4 is a graphical representation showing a photoconductivity distribution at a pulse modulation frequency of 10 KHz described in Example 2;1

FIG. 3 is a graphical representation showing the film forming rate (deposition rate) distribution depending on the location (position) on the substrate surface, as measured at the pulse modulation frequency of 10 KHz described above, and FIG. 4 is a graphical representation showing the variation of the photoconductivity, dark conductivity, and photo/dark conductivity ratio, obtained at the pulse modulation frequency of 10 KHz described above. In FIGS. 3 and 4, the position on the abscissa indicates the distance from the upstream end of the substrate in the gas flow direction 5 in FIG. 1.

EXAMPLE 3

In Example 3, the content of $SiH_2$ in each of non-crystalline silicon films was determined with the modulation frequency of 10 KHz and with the duty changed from 10% to 80% by the procedure described in Example 2 using the deposited film forming apparatus of the plasma CVD method according to the present invention with the configuration shown in FIG. 1.

The plasma reaction space was 860 mm×510 mm, the cathode electrode size was 854 mm×504 mm, and the electrode coupling capacitance ratio was set to 1/1. 1000 sccm of diluting hydrogen gas and 500 sccm of $SiH_4$ gas were flown into the plasma reaction space. The reaction space pressure was maintained at 133 Pa. A high frequency power of VHF 60 MHz was pulse-modulated under the above mentioned conditions and applied to the cathode electrode, and the film formation was performed for ten minutes to deposit a non-crystalline silicon film on a silicon wafer substrate and a glass substrate, respectively.

Then, the infrared absorption spectrum and the photo/dark conductivities of the deposited non-crystalline silicon films were measured and evaluated using the measuring methods described in Examples 1 and 2.

Figure 6:
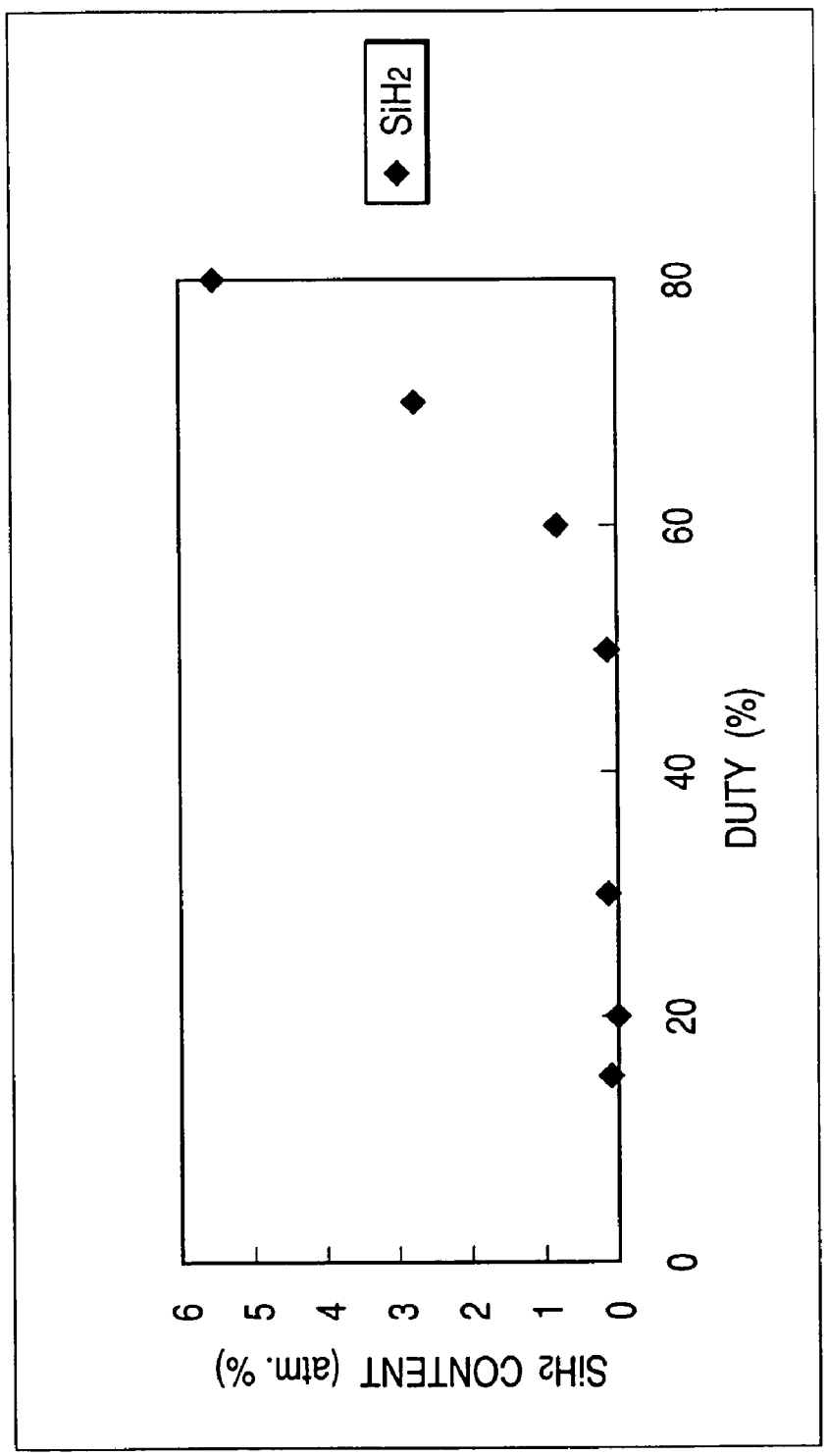
FIG. 6 is a graphical representation showing the dependency of $SiH_2$ content of the thin film on the pulse modulation duty described in Example 3.

As a result, with each duty from 15% to 60%, the $SiH_2$ content of the thin film was 1 atomic % or less as shown in FIG. 6, and the photo/dark conductivity ratio σp/σd showed values of five or more figures, which were good results. However, with the duty of 10%, the discharge became unstable.

EXAMPLE 4

In Example 4, the reaction space was 510 mm×510 mm, the cathode electrode size was 504 mm×504 mm, and the electrode coupling capacitance ratio was set to 2/1.

The film forming process was performed following the procedure described in Example 2. For film formation, 500 sccm of $SiH_2$ source gas and 1000 sccm of diluting hydrogen gas were flown into the plasma reaction space.

Then, the pressure inside the plasma reaction space was controlled to be 133 Pa, a high frequency power of VHF 150 MHz and 800 W was pulse-modulated with a modulation frequency of 10 KHz and a duty of 50% and supplied to the cathode electrode, and the film formation was performed for 10 minutes. Thus, the high frequency power of the VHF band was supplied, and a non-crystalline silicon film was deposited on a glass substrate and a silicon wafer substrate, respectively.

Then, the supply of the high frequency power of the VHF band was stopped, and then the supply of the source and diluting gases and the heater power were stopped. Next, the inside of the vacuum vessel and exhaust means were purged, and the apparatus was brought into atmospheric pressure using $H_2$ gas.

Then, the infrared absorption spectrum and the photo/dark conductivities were measured and evaluated for the non-crystalline silicon films on the glass substrate and the silicon wafer substrate using the measuring method described in Examples 1 and 2.

As a result, the $SiH_2$ contents of the non-crystalline silicon films were 0.2 atomic %, which were evaluated to be good non-crystalline silicon films.

COMPARATIVE EXAMPLE

In a comparative example, the reaction space was 860 mm×510 mm, the cathode electrode size was 854 mm×504 mm, and the electrode coupling capacitance ratio was set to 1/1. Under the conditions of the flow rate of $SiH_4$ of 500 sccm, the flow rate of $H_2$ of 1000 sccm, the film forming pressure of 133 Pa, and the high frequency power of 60 MHz, and 400 W, a high frequency power was supplied to the discharge space without application of pulse modulation. The film formation was performed following the procedure of Example 2.

Then, the infrared absorption spectrum was measured using the measuring method described in Example 1.

As a result, the content of $SiH_2$ in the thin film was 2.2 atomic %, which showed a film quality inferior to the quality of the films formed with pulse modulation.

EXAMPLE 5

In Example 5, the deposited film forming apparatus using the plasma CVD according to the present invention with the configuration shown in FIG. 1 was used, and a modulation frequency of 10 KHz and a duty of 50% were adopted to deposit a microcrystalline silicon film on a glass substrate.

The plasma reaction space was 510 mm×510 mm, the cathode electrode size was 504 mm×504 mm, and the electrode coupling capacitance ratio was set to 1/2. 2000 sccm of diluting hydrogen gas and 50 sccm of $SiH_4$ gas were flown into the plasma reaction space, and the glass substrate was heated to and maintained at 300° C. The pressure inside the reaction space was maintained at 266 Pa.

A high frequency power of VHF 60 MHz and 1200 W was pulse-modulated under the above mentioned conditions and applied to the cathode electrode, and the film formation was performed for 60 minutes to deposit a microcrystalline silicon film on a glass substrate. Then, when the deposited microcrystalline silicon film was measured by use of a Raman spectroscope (trade name: NRS200C, mfd. by Nihon Bunko), a sharp signal rising was observed in the vicinity of 520 $cm^{-1}$ to confirm the crystallinity.

It was confirmed that when the electrode coupling capacitance ratio was set to 1/2 which was much greater than the conventional ratio 1/5, and the high frequency power was supplied under the pulse modulation, the crystallinity was improved as compared with the conventionally obtained films.

As described above, according to the above mentioned embodiments of the present invention, the productivity of the products using semiconductors of especially silicon-based non-crystalline or microcrystalline thin films, etc. can be improved, and a semiconductor of a silicon-based non-crystalline or microcrystalline thin film, etc. with better quality than conventional products can be formed with a large area at a higher speed. Additionally, no defects will occur in the processed articles, and a better-quality functional thin film free from photodegradation and a high-quality thin film can be formed.

Furthermore, also in deposited film formation using the plasma CVD method, the spattering method, etc., a large-area plasma can be realized, and a deposited film processing can be made possible without generation of defects, which cannot be realized in the conventional technology. In addition, the present invention can be applied to the plasma etching with good results.

What is claimed is:

1. A parallel plate plasma CVD processing apparatus having a discharge space having provided therein a cathode electrode and a grounding electrode opposed to the cathode electrode, for introducing a gas into the discharge space, converting the gas into a plasma by a high frequency power and depositing a film on a surface of the grounding electrode facing the cathode electrode, the apparatus comprising:

at least one conductor plate provided on a back side of the cathode electrode and d.c. potentially insulated from the cathode electrode and the grounding electrode;

a shielding wall for enclosing the cathode electrode and the conductor plate;

a discharge space defined by the shielding wall and the grounding electrode and configured such that an electrode coupling capacitance ratio of (i) an inter-electrode coupling capacitance provided by the cathode electrode and the grounding electrode to (ii) a coupling capacitance provided by the cathode electrode and a bottom surface of the shielding wall on the back side of the conductor plate is 1/3 or more, said grounding electrode supporting a rear surface of the deposited film;

power supply means for supplying a high frequency power with a pulse modulation directly to the cathode electrode to convert the gas into a plasma;

pulse modulation means for setting a modulation frequency of the pulse modulation to 50 Hz to 100 KHz; and means for setting a percentage (duty) of a high frequency application time to a period of a modulation frequency of the pulse modulation within a range of 15% to 60%, wherein the apparatus is configured such that a high frequency power of a frequency of 30 MHz to 150 MHz is supplied as the high frequency power from a high frequency power source.

* * * * *